United States Patent
Feng et al.

(10) Patent No.: US 12,230,723 B2
(45) Date of Patent: Feb. 18, 2025

(54) BACK-SIDE METAL ELECTRODE OF N-TYPE TOPCon SOLAR CELL, AND METHOD FOR PREPARING BACK-SIDE METAL ELECTRODE OF N-TYPE TOPCon SOLAR CELL, AND N-TYPE TOPCon SOLAR CELL

(71) Applicant: CHINT NEW ENERGY TECHNOLOGY CO., LTD., Zhejiang (CN)

(72) Inventors: Mingzhang Feng, Zhejiang (CN); Jinfang Yang, Zhejiang (CN); Sheng He, Zhejiang (CN); Wei-Chih Hsu, Taiwan (TW)

(73) Assignee: CHINT NEW ENERGY TECHNOLOGY CO., LTD., Zhejiang (CN)

( * ) Notice: Subject to any disclaimer, the term of this patent is extended or adjusted under 35 U.S.C. 154(b) by 0 days.

(21) Appl. No.: 18/039,201

(22) PCT Filed: May 10, 2021

(86) PCT No.: PCT/CN2021/092544
§ 371 (c)(1),
(2) Date: May 26, 2023

(87) PCT Pub. No.: WO2022/142054
PCT Pub. Date: Jul. 7, 2022

(65) Prior Publication Data
US 2023/0420583 A1     Dec. 28, 2023

(30) Foreign Application Priority Data
Dec. 28, 2020   (CN) .................. 202011582094.X

(51) Int. Cl.
*H01L 31/0224*     (2006.01)
*H01L 31/0216*     (2014.01)
(Continued)

(52) U.S. Cl.
CPC ............... *H01L 31/022433* (2013.01); *H01L 31/02168* (2013.01); *H01L 31/02363* (2013.01); *H01L 31/1868* (2013.01)

(58) Field of Classification Search
CPC ......... H01L 31/02167; H01L 31/02168; H01L 31/022433; H01L 31/02363; H01L 31/0745; H01L 31/1804; H01L 31/1868
See application file for complete search history.

(56) References Cited

U.S. PATENT DOCUMENTS
2019/0326451 A1   10/2019   Chang et al.

FOREIGN PATENT DOCUMENTS
CN    102479883 A    5/2012
CN    104205360 A    12/2014
(Continued)

OTHER PUBLICATIONS

CN 112687755 A machine translation as provided by FIT database, translated on Jun. 15, 2024.*
(Continued)

*Primary Examiner* — Golam Mowla
(74) *Attorney, Agent, or Firm* — The Sun IP Law

(57) ABSTRACT

Some embodiments of the present invention relate to a technical field of N-type TOPCon solar cells, and disclose a back-side metal electrode of an N-type TOPCon solar cell. The back-side metal electrode includes a substrate, a plurality of first silver fine grids disposed on a passivation film which is on a back side of the substrate, a plurality of second aluminum fine grids overlaid on the plurality of first silver fine grids, and a plurality of first silver main grids disposed
(Continued)

perpendicular to the plurality of first silver fine grids. Each of the plurality of first silver main grids is a segmented structure. The back-side metal electrode further includes a plurality of second aluminum main grids, which are formed, in a printing manner, between any two adjacent grid segments of a plurality of grid segments and around each of the plurality of grid segments.

20 Claims, 2 Drawing Sheets

(51) Int. Cl.
*H01L 31/0236* (2006.01)
*H01L 31/18* (2006.01)

(56) References Cited

FOREIGN PATENT DOCUMENTS

| | | | |
|---|---|---|---|
| CN | 105564065 | A | 5/2016 |
| CN | 106409956 | A | 2/2017 |
| CN | 107331735 | A | 11/2017 |
| CN | 108365026 | A | 8/2018 |
| CN | 109148616 | A | 1/2019 |
| CN | 208806262 | U | 4/2019 |
| CN | 109904249 | A | 6/2019 |
| CN | 110047952 | A | 7/2019 |
| CN | 110098265 | A | 8/2019 |
| CN | 110165010 | A | 8/2019 |
| CN | 209487520 | U | 10/2019 |
| CN | 110444614 | A | 11/2019 |
| CN | 209675297 | U | 11/2019 |
| CN | 110660883 | A | 1/2020 |
| CN | 110890432 | A | 3/2020 |
| CN | 111180535 | A | 5/2020 |
| CN | 210866198 | U | 6/2020 |
| CN | 210926031 | U | 7/2020 |
| CN | 112687755 | A | 4/2021 |

OTHER PUBLICATIONS

The extended European search report of the corresponding EP patent application No. 21912815.4, mail date Jan. 23, 2024.

Ok Young-Woo et al: "Screen printed, large area bifacial N-type back junction silicon solar cells with selective phosphorus front surface field and boron doped poly-Si/SiOx passivated rear emitter", Applied Pphysics Letters, American Institute of Physics, 2 Huntington Quadrangle, Melville, NY 11747, vol. 113, No. 26, Dec. 26, 2018(Dec. 26, 2018), XP012234274.

Jeon Minhan et al: "Passivation effect of tunnel oxide grown by N2O plasma for c-Si solar cell applications", Vacuum, vol. 141, Mar. 31, 2017 (Mar. 31, 2017), pp. 152-156, XP085018232.

\* cited by examiner

BACK-SIDE METAL ELECTRODE OF N-TYPE TOPCon SOLAR CELL, AND METHOD FOR PREPARING BACK-SIDE METAL ELECTRODE OF N-TYPE TOPCon SOLAR CELL, AND N-TYPE TOPCon SOLAR CELL

CROSS-REFERENCE TO RELATED APPLICATION

This disclosure claims priority to Chinese Patent Application No. 202011582094.X filed to the China National Intellectual Property Administration on May 10, 2021 and entitled "Back-Side Metal Electrode of N-Type TOPCon Solar Cell, and Method for Preparing Back-Side Metal Electrode of N-Type TOPCon Solar Cell, and N-type TOPCon Solar Cell".

TECHNICAL FIELD

The present disclosure relates to a technical field of N-type TOPCon solar cells, and specifically to a back-side metal electrode of an N-type TOPCon solar cell, a method for preparing a back-side metal electrode of N-Type TOPCon Solar Cell, and an N-type TOPCon solar cell using a back-side metal electrode as a back-side electrode.

BACKGROUND

With the continuous development of solar cells, the development and manufacturing of high-efficiency, stable and low-cost solar cells are the focus of the industries today. Compared with a P-type crystalline silicon cell, an N-type crystalline silicon cell is long in minority carrier lifetime, good in weak light effect and low in temperature coefficient, has no light-induced attenuation, and is the hope of crystalline silicon solar cells marching toward theoretical maximum efficiency.

The substrate of an N-type TOPCon cell is an N-type Si wafer; a $P^+$ doped layer is obtained on the front side by means of B diffusion, and a corresponding passivation dielectric film is deposited on the front side by means of Atomic Layer Deposition (ALD) or Plasma Enhanced Chemical Vapor Deposition (PECVD); and a corresponding passivation dielectric film and an N+ doped layer are deposited on the back side by means of PECVD or Low Pressure Chemical Vapor Deposition (LPCVD). Corresponding metal electrodes are usually obtained on the front and back sides by means of screen printing. Silver aluminum paste is used on the front side, and silver paste is used on the back side. Compared with a P-type Passivated Emitter and Rear Cell (PERC) cell, although using the silver paste on the back side of the N-type TOPCon cell can guarantee a higher double-sided ratio, the manufacturing cost of the cell is increased at the same time, such that, in order to meet the principle of efficiency improvement and cost reduction of the N-type TOPCon cell, the use of the silver paste on the back side should be reduced as much as possible.

In order to reduce the use cost of the silver paste on the back side of the N-type TOPCon cell, some current researchers use a method for metallizing the back side of the P-type PERC cell, that is, a passivation dielectric film is partially removed from the back side by means of laser ablation, then aluminum paste is printed, and a metal electrode with an ohmic contact is formed by means of sintering. On the one hand, the method requires additional device costs for laser ablation, and on the other hand, the method may damage the passivation dielectric film over a larger area, resulting in reduction of a passivation effect and reduction of electrode efficiency on the back side, thus affecting the Voc of the cell, and reducing cell efficiency. In addition, the line resistance of a metal grid line printed by singly using the aluminum paste is higher than that of a silver grid line, such that the FF of the cell is affected, resulting in reduction of cell efficiency.

SUMMARY

In order to solve the problem of high costs caused by use of silver paste to perform electrode printing on a back side of an N-type TOPCon cell, the present disclosure is intended to provide a back-side metal electrode of an N-type TOPCon solar cell, so as to reduce the use of silver paste on the back side, and prevent the performance of the electrode from being affected.

Some embodiments of the present disclosure provide a method for preparing the above back-side metal electrode of an N-type TOPCon solar cell.

Some embodiments of the present disclosure provide an N-type TOPCon solar cell using the above back-side metal electrode.

Some embodiments of the present disclosure provide the following technical solutions.

A back-side metal electrode of an N-type TOPCon solar cell includes a substrate, and further includes a plurality of first silver fine grids disposed on a passivation film on a back side of the substrate, a plurality of second aluminum fine grids overlaid on the plurality of first silver fine grids, and a plurality of first silver main grids disposed perpendicular to the plurality of first silver fine grids, wherein each of the plurality of first silver main grids is of a segmented structure, and the segmented structure includes a plurality of grid segments which are disposed interval; and the back-side metal electrode further includes a plurality of second aluminum main grids, which are formed, in a printing manner, between any two adjacent grid segments of the plurality of grid segments and around each of the plurality of grid segments.

According to the back-side metal electrode of an N-type TOPCon solar cell of the present disclosure, the plurality of first silver fine grids and the plurality of first silver main grids are printed on the passivation film; each of the plurality of first silver main grids is designed in a segmented structure; then the plurality of second aluminum fine grids are overprinted on the plurality of first silver fine grids; and the plurality of second aluminum main grids are printed on the remaining part of the plurality of first silver main grids, that is, between any two adjacent grid segments of the plurality of grid segments and around each of the plurality of grid segments, so as to make the plurality of second aluminum main grids and the plurality of first silver main grids form a partial contact channel. In this way, back-side carriers are collected by first passing through the plurality of first silver fine grids, then are transmitted to the plurality of second aluminum fine grids, are gathered to the plurality of second aluminum main grids, then are in contact with part of the plurality of second aluminum main grids by means of the plurality of first silver main grids, and are transferred to an external circuit by means of the plurality of first silver main grids, such that the silver paste is prevented from being excessively used on the back-side metal electrode, but is partially replaced with the aluminum paste. In addition, a technical problem known to the inventors that laser ablation is required to remove the passivation dielectric film as the silver paste is completely replaced with the aluminum paste is avoided, such that the transmission loss of the carriers is reduced, the FF of the cell is improved, transmission channels of the carriers are increased, a series resistance is reduced, and cell efficiency is improved.

In some embodiments of the present disclosure, a number of the plurality of first silver fine grids is 106-122, and a width of each of the plurality of first silver fine grids is 25-40 μm, and a height of the plurality of first silver fine grids is 5-10 μm.

In some embodiments of the present disclosure, a number of the plurality of first silver main grids is 5-12, and a number of the plurality of grid segments in each of the first silver main grids is 4-12, and a length of each of the plurality of grid segments is 2-8 mm, and a width of each of the plurality of grid segments is 0.1-2 mm, and a height of each of the plurality of grid segments is 4-8 μm.

In some embodiments of the present disclosure, a number of the plurality of second aluminum fine grids is 106-122, and a width of each of the plurality of second aluminum fine grids is 35-45 μm, and a height of each of the plurality of second aluminum fine grids is 10-20 μm.

In some embodiments of the present disclosure, a number of the plurality of second aluminum main grids is 5-12, and a width of each of the plurality of second aluminum main grids is 0.3-3.0 μm, and a height of each of the plurality of second aluminum main grids is 10-30 μm.

The method for preparing the above back-side metal electrode of an N-type TOPCon solar cell includes the following steps.

(1) An SiOx film layer and a Poly-Si film layer are deposited on a substrate by means of LPCVD, an $N^+$ doped layer is formed on the Poly-Si film layer by means of P diffusion, and then a back-side SiNxHy film layer is deposited by means of LPCVD.

(2) A plurality of first silver fine grids and a plurality of first silver main grids, the plurality of firstly silver fine grids and the plurality of first silver main grids are perpendicular to each other, are formed by printing silver paste on the back-side SiNxHy film layer.

(3) A plurality of second aluminum fine grids are formed by overprinting aluminum paste on the plurality of first silver fine grids, and a plurality of second aluminum main grids are formed, in a printing manner, between any two adjacent grid segments of the plurality of grid segments and around each of the plurality of grid segments.

In a printing method of the present disclosure, the plurality of first silver fine grids are firstly printed, and the plurality of second aluminum fine grids are then overprinted, such that the transmission efficiency of metal electrode fine grids to the carriers is improved, the part of the passivation film is prevented from being removed, and the loss of the carriers is reduced. In addition, in the printing method of the present disclosure, the plurality of first silver fine grids and the plurality of first silver main grids are simultaneously printed, such that printing efficiency is improved, and a structure where the plurality of first silver fine grids are in contact with the plurality of first silver main grids is formed. Compared with a complete traditional channel of first silver fine grid-second aluminum fine grid-second aluminum main grid-first silver main grid, a transmission channel with shorter part of first silver fine grid-first silver main grid is provided at a contact part, such that the transmission efficiency of the carriers is improved.

In some embodiments of the present disclosure, a thickness of the SiOx film layer is 1-8 nm; a thickness of the Poly-Si film layer is 100-200 nm; and a thickness of the back-side SiNxHy film layer is 50-100 nm.

The present disclosure provides an N-type TOPCon solar cell using the above back-side metal electrode.

In some embodiments of the present disclosure, a front side of a substrate includes a $P^+$ layer formed by means of B diffusion, a front-side anti-reflection coating consisting of an AlOx film layer deposited by means of ALD or PECVD and a front-side SiNxHy film layer deposited by means of PECVD, and a metal grid line electrode formed, in a printing manner, on the front-side anti-reflection coating.

A thickness of the AlOx passivation film is 2-15 nm, and a thickness of the front-side SiNxHy passivation film is 50-100 nm.

In some embodiments of the present disclosure, the metal grid line electrode is formed by printing and sintering silver and aluminum paste.

There are following beneficial effects of the present disclosure:

The method known to the inventors, a back-side metal electrode of an N-type TOPCon cell is prepared by directly using silver paste printing, and compared with a P-type PERC cell, the manufacturing cost is high, and efficiency advantages cannot be highlighted, that is, the manufacturing cost of the solar cell per watt cannot be significantly reduced. In the method of the present disclosure, the back side is firstly printed with silver paste to obtain the plurality of first fine grid lines and a plurality of segmented silver main grids; and then aluminum paste overprinting is used on the plurality of first fine grid lines, so as to obtain a plurality of second fine grid lines, and the remaining a plurality of aluminum main grids are obtained on the plurality of segmented silver main grids in a printing manner.

1) The plurality of first fine grid lines are obtained by printing the silver paste, such that damage to the passivation dielectric film over a larger area caused by laser grooving when aluminum line printing is directly used, which prevented from affecting the passivation effect of the back surface.

2) The plurality of second fine grids are obtained by overprinting the aluminum paste on the plurality of first fine grids, such that on the one hand, the consumption of the silver paste can be reduced, and the cost is thus reduced; and on the other hand, transmission channels of carriers can be increased, a series of resistance is reduced, and the cell efficiency is improved.

3) The main grid of the back-side metal electrode is prepared by a silver-aluminum butt joint manner, such that the soldering requirements for the back side of a cell are met, and the consumption of main grid silver paste is also reduced, thereby reducing the cost.

4) Compared with the existing processing method completely using the aluminum paste, the metal electrode manufacturing method does not need to additionally increase a laser ablation device, such that the manufacturing cost of the cell is greatly reduced.

BRIEF DESCRIPTION OF THE DRAWINGS

FIG. 1 illustrates a view of an electrode distribution structure of a back-side metal electrode of an N-type TOPCon cell that is prepared by a method of the present disclosure, wherein FIG. 1(a) illustrates a position relationship between a plurality of first silver fine grids and a plurality of first silver main grids;

FIG. 1(b) illustrates a position relationship between a plurality of second aluminum fine grids and a plurality of second aluminum main grids; and FIG. 1(c) illustrates a position relationship between the plurality of first silver main grids and the plurality of second aluminum main grids.

Figure 1:
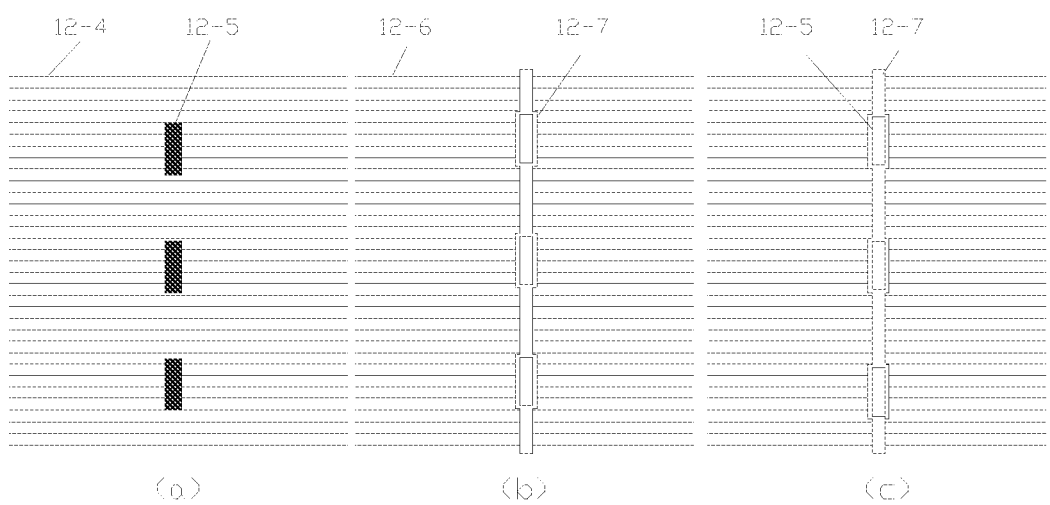

In the drawings: 1, Substrate; 11-1, P+ layer; 11-2, AlOx film layer; 11-3, Front-side SiNxHy film layer; 11-4, H-type metal grid line electrode, 12-1, SiOx film layer; 12-2, Poly-Si film layer; 12-3, Back-side SiNxHy film layer; 12-4, First silver fine grid; 12-5, First silver main grid; 12-6, Second aluminum fine grid; 12-7, Second aluminum main grid.

DETAILED DESCRIPTION OF THE EMBODIMENTS

Specific implementations of the present disclosure are further described below.

Unless otherwise specified, raw materials used in the present disclosure are commercially available or commonly used in the art; and unless otherwise specified, methods in the following embodiments are conventional in the art.

Embodiment 1

A back-side metal electrode of an N-type TOPCon solar cell includes a substrate 1; a back side of the substrate is provided with an N+ layer by means of P diffusion; a back-side passivation film is provided on the N+ layer, and consists of an SiOx film layer 12-1, a Poly-Si film layer 12-2 and a back-side SiNxHy film layer 12-3; and the back-side passivation film is provided with a first silver fine grid 12-4, a second aluminum fine grid 12-6, a second aluminum main grid 12-7 and a first silver main grid 12-5. The second aluminum fine grid is prepared by overprinting aluminum paste on the first silver fine grid; the first silver fine grid is arranged perpendicular to the first silver fine grid, and include a plurality of grid segments which are disposed interval; and the second aluminum main grid is filled and printed between any two adjacent grid segments of the plurality of grid segments and around each of the plurality of grid segments, so as to make the first silver main grids form a partial contact with the second aluminum main grids.

The method for preparing the above back-side metal electrode of an N-type TOPCon solar cell includes the following steps:

(1) An SiOx film layer and a Poly-Si film layer are deposited on the back side of the substrate by means of LPCVD, and an N+-doped Poly-Si film layer is formed by means of P diffusion; then the back-side SiNxHy film layer is deposited by means of LPCVD, so as to form a back-side passivation film; and a thickness of the SiOx film layer is 1 nm, a thickness of the Poly-Si film layer is 100 nm, and a thickness of the back-side SiNxHy film layer is 50 nm.

(2) As shown in FIG. 1(a), the plurality of first silver fine grids 12-4 and the plurality of first silver main grids 12-5, which are perpendicular to each other, are formed by synchronously printing the silver paste on the back-side SiNxHy passivation film. A number of the plurality of first silver fine grids is 106, and a width of each of the plurality of first silver fine grids is 40 μm, and a height of each of the plurality of first silver fine grids is 10 μm; and a number of the plurality of first silver main grids is 5, the plurality of grid segments in each of the first silver main grids is 4, and each of the plurality of grid segments has a length of 4 mm, a width of 0.1 mm and a height of 4 μm.

(3) As shown in FIG. 1(b), the plurality of second aluminum fine grids 12-6 are formed by overprinting the aluminum paste on the plurality of first silver fine grids; and the plurality of second aluminum main grids 12-7 are formed, in a printing manner, between any two adjacent grid segments of the plurality of grid segments and around each of the plurality of grid segments. A number of the plurality of second aluminum fine grids is 106, with the width being 45 μm and the height being 20 μm; and a number of the plurality of second aluminum main grids is 5, with the width being 0.3 μm and the height being 10 μm. In this way, the back-side metal electrode 1(c) in which the plurality of first silver main grids are in partial contact with the plurality of second aluminum main grids is obtained by means of metal screen printing.

Figure 2:
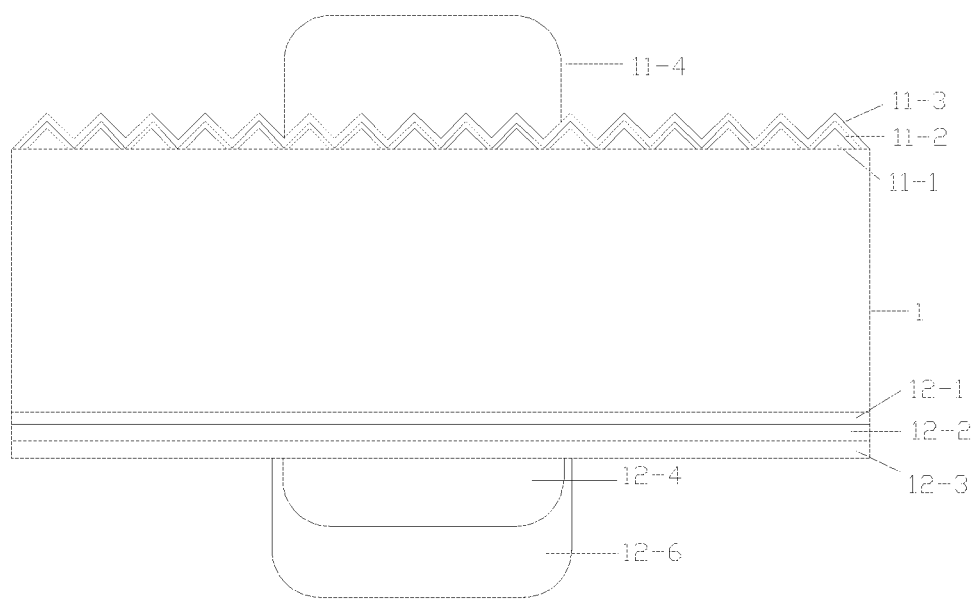
FIG. 2 illustrates a cross-sectional view of an N-type TOPCon solar cell prepared by a method of the present disclosure.

In the N-type TOPCon solar cell including the back-side metal electrode, as shown in FIG. 2, a front side of the substrate of the cell is formed with a P+ layer 11-1 by means of B diffusion, is provided with a front-side anti-reflection coating, which including an AlOx film layer 11-2 deposited by means of ALD and a front-side SiNxHy film layer 11-3 deposited by means of PECVD. A thickness of the AlOx film layer is 6 nm, and a thickness of the front-side SiNxHy film layer is 70 nm. Then, an H-type metal grid line electrode 11-4 is prepared by printing and sintering silver and aluminum paste on the front-side anti-reflection coating; the main grid is 9BB; and the number of fine grid is 106, with the width being 35 μm and the height being 15 μm.

Embodiment 2

A back-side metal electrode of an N-type TOPCon solar cell. The difference between these embodiments and the above embodiments lies in that, the number of the plurality of first silver fine grids is 122, with the width being 30 μm and the height being 10 μm; the number of the plurality of first silver main grids is 8, the number of the plurality of grid segments in each first silver main grid is 8, and each grid segment has a length of 8 mm, a width of 1 mm and a height of 6 μm; the number of the plurality of second aluminum fine grids is 122, with the width being 35 μm and the height being 15 μm; and the number of the plurality of second aluminum main grids is 8, with the width being 2.0 μm and the height being 15 μm.

Embodiment 3

A back-side metal electrode of an N-type TOPCon solar cell. The difference between these embodiment and the above embodiments lies in that, the number of the plurality of first silver fine grids is 110, with the width being 25 μm and the height being 5 μm; the number of the plurality of first silver main grids is 12, the number of the plurality of grid segments in each first silver main grid is 12, and each grid segment has a length of 2 mm, a width of 2 mm and a height of 8 μm; the number of the plurality of second aluminum fine grids is 110, with the width being 40 μm and the height being 10 μm; and the number of the plurality of second aluminum main grids is 12, with the width being 3.0 μm and the height being 30 μm.

Comparative Example 1

A back-side metal electrode of an N-type TOPCon solar cell is prepared by completely printing silver paste; and specific structure parameters are as follows: the number of silver grids is 116, with the width being 40 μm and the height being 13 μm; and the rest is the same as that in Embodiment 1.

Then an N-type TOPCon solar cell is prepared by using the back-side metal electrode in Comparative example 1; and the remaining structures and parameters are the same as that of the N-type TOPCon solar cell in Embodiment 1.

Performance Test

The performance processes of the N-type TOPCon solar cell obtained in Embodiments 1-3 and Comparative example 1 are tested, and results are shown in the figures below.

| Item | Short-circuit current Isc(mA/cm$^2$) | Open-circuit voltage Uoc(V) | Series resistance Rs(mΩ) | Fill factor (FF %) | Conversion efficiency (Ncell %) |
|---|---|---|---|---|---|
| Embodiment 1 | 40.66 | 0.706 | 1.7 | 82.27 | 23.62 |
| Embodiment 2 | 40.66 | 0.702 | 1.4 | 82.72 | 23.61 |
| Embodiment 3 | 40.66 | 0.700 | 1.2 | 83.02 | 23.63 |
| Comparative example 1 | 40.66 | 0.706 | 1.9 | 81.97 | 23.54 |

It can be seen, from the above table, that compared with complete silver paste, using the technical solution of the present application can improve the conversion efficiency and fill factor of the N-type TOPCon solar cell, significantly reduces the size of the series resistance, and is lower in cost compared to complete silver paste.

What is claimed is:

1. A back-side metal electrode of an N-type TOPCon solar cell, comprising a substrate, and further comprising a plurality of first silver fine grids disposed on a passivation film which is on a back side of the substrate, a plurality of second aluminum fine grids overlaid on the plurality of first silver fine grids, and a plurality of first silver main grids disposed perpendicular to the plurality of first silver fine grids, wherein each of the plurality of first silver main grids is a segmented structure, and the segmented structure comprises a plurality of grid segments which are disposed at intervals; and the back-side metal electrode further comprises a plurality of second aluminum main grids, which are formed, in a printing manner, between any two adjacent grid segments of the plurality of grid segments and around each of the plurality of grid segments.

2. The back-side metal electrode of an N-type TOPCon solar cell as claimed in claim 1, wherein a number of the plurality of first silver fine grids is 106-122, and a width of each of the plurality of first silver fine grids is 25-40 μm, and a height of the plurality of first silver fine grids is 5-10 μm.

3. The back-side metal electrode of an N-type TOPCon solar cell as claimed in claim 1, wherein a number of the plurality of first silver main grids is 5-12, and a number of the plurality of grid segments in each of the first silver main grids is 4-12, and a length of each of the plurality of grid segments is 2-8 mm, and a width of each of the plurality of grid segments is 0.1-2 mm, and a height of each of the plurality of grid segments is 4-8 μm.

4. The back-side metal electrode of an N-type TOPCon solar cell as claimed in claim 1, wherein a number of the plurality of second aluminum fine grids is 106-122, and a width of each of the plurality of second aluminum fine grids is 35-45 μm, and a height of each of the plurality of second aluminum fine grids is 10-20 μm.

5. The back-side metal electrode of an N-type TOPCon solar cell as claimed in claim 1, wherein a number of the plurality of second aluminum main grids is 5-12, and a width of each of the plurality of second aluminum main grids is 0.3-3.0 μm, and a height of each of the plurality of second aluminum main grids is 10-30 μm.

6. A method for preparing the back-side metal electrode of an N-type TOPCon solar cell as claimed in claim 1, comprising the following steps:
    (1) depositing an SiOx film layer and a Poly-Si film layer on a substrate by means of LPCVD, forming an N+ doped layer on the Poly-Si film layer by means of P diffusion, and then depositing a back-side SiNxHy film layer by means of LPCVD;
    (2) forming a plurality of first silver fine grids and a plurality of first silver main grids, the plurality of first silver fine grids and the plurality of first silver main grids are perpendicular to each other, by printing silver paste on the back-side SiNxHy film layer; and
    (3) forming a plurality of second aluminum fine grids by overprinting aluminum paste on the plurality of first silver fine grids, and forming, in a printing manner, a plurality of second aluminum main grids between any two adjacent grid segments of the plurality of grid segments and around each of the plurality of grid segments.

7. The method for preparing the back-side metal electrode of an N-type TOPCon solar cell as claimed in claim 6, wherein a thickness of the SiOx film layer is 1-8 nm; a thickness of the Poly-Si film layer is 100-200 nm; and a thickness of the back-side SiNxHy film layer is 50-100 nm.

8. An N-type TOPCon solar cell using a back-side metal electrode as claimed in claim 1.

9. The N-type TOPCon solar cell as claimed in claim 8, wherein a front side of a substrate comprises a P$^+$ layer formed by means of B diffusion, a front-side anti-reflection coating consisting of an AlOx film layer deposited by means of ALD or PECVD and a front-side SiNxHy film layer deposited by means of PECVD, and a metal grid line electrode formed, in a printing manner, on the front-side anti-reflection coating; and
    a thickness of the AlOx film layer is 2-15 nm, and a thickness of the front-side SiNxHy film layer is 50-100 nm.

10. The solar cell as claimed in claim 9, wherein the metal grid line electrode is formed by printing and sintering silver and aluminum paste.

11. The back-side metal electrode of an N-type TOPCon solar cell as claimed in claim 1, wherein a number of the plurality of first silver fine grids is 106, and a width of each of the plurality of first silver fine grids is 40 μm, and a height of the plurality of first silver fine grids is 10 μm;
    wherein a number of the plurality of first silver main grids is 5, and a number of the plurality of grid segments in each of the first silver main grids is 4, and a length of each of the plurality of grid segments is 4 mm, and a width of each of the plurality of grid segments is 0.1 mm, and a height of each of the plurality of grid segments is 4 μm;
    wherein a number of the plurality of second aluminum fine grids is 106, and a width of each of the plurality of second aluminum fine grids is 45 μm, and a height of each of the plurality of second aluminum fine grids is 20 μm;
    wherein a number of the plurality of second aluminum main grids is 5, and a width of each of the plurality of second aluminum main grids is 0.3 μm, and a height of each of the plurality of second aluminum main grids is 10 μm.

12. The back-side metal electrode of an N-type TOPCon solar cell as claimed in claim 1, wherein a number of the plurality of first silver fine grids is 122, and a width of each of the plurality of first silver fine grids is 30 μm, and a height of the plurality of first silver fine grids is 10 μm;
   wherein a number of the plurality of first silver main grids is 8, and a number of the plurality of grid segments in each of the first silver main grids is 8, and a length of each of the plurality of grid segments is 8 mm, and a width of each of the plurality of grid segments is 1 mm, and a height of each of the plurality of grid segments is 6 μm;
   wherein a number of the plurality of second aluminum fine grids is 122, and a width of each of the plurality of second aluminum fine grids is 35 μm, and a height of each of the plurality of second aluminum fine grids is 15 μm;
   wherein a number of the plurality of second aluminum main grids is 8, and a width of each of the plurality of second aluminum main grids is 2 μm, and a height of each of the plurality of second aluminum main grids is 15 μm.

13. The method for preparing the back-side metal electrode of an N-type TopCon solar cell as claimed in claim 6, wherein a number of the plurality of first silver fine grids is 106-122, and a width of each of the plurality of first silver fine grids is 25-40 μm, and a height of the plurality of first silver fine grids is 5-10 μm.

14. The method for preparing the back-side metal electrode of an N-type TopCon solar cell as claimed in claim 6, wherein a number of the plurality of first silver main grids is 5-12, and a number of the plurality of grid segments in each of the first silver main grids is 4-12, and a length of each of the plurality of grid segments is 2-8 mm, and a width of each of the plurality of grid segments is 0.1-2 mm, and a height of each of the plurality of grid segments is 4-8 μm.

15. The method for preparing the back-side metal electrode of an N-type TopCon solar cell as claimed in claim 6, wherein a number of the plurality of second aluminum fine grids is 106-122, and a width of each of the plurality of second aluminum fine grids is 35-45 μm, and a height of each of the plurality of second aluminum fine grids is 10-20 μm.

16. The method for preparing the back-side metal electrode of an N-type TopCon solar cell as claimed in claim 6, wherein a number of the plurality of second aluminum main grids is 5-12, and a width of each of the plurality of second aluminum main grids is 0.3-3.0 μm, and a height of each of the plurality of second aluminum main grids is 10-30 μm.

17. The N-type TOPCon solar cell as claimed in claim 8, wherein a number of the plurality of first silver fine grids is 106-122, and a width of each of the plurality of first silver fine grids is 25-40 μm, and a height of the plurality of first silver fine grids is 5-10 μm.

18. The N-type TOPCon solar cell as claimed in claim 8, wherein a number of the plurality of first silver main grids is 5-12, and a number of the plurality of grid segments in each of the first silver main grids is 4-12, and a length of each of the plurality of grid segments is 2-8 mm, and a width of each of the plurality of grid segments is 0.1-2 mm, and a height of each of the plurality of grid segments is 4-8 μm.

19. The N-type TOPCon solar cell as claimed in claim 8, wherein a number of the plurality of second aluminum fine grids is 106-122, and a width of each of the plurality of second aluminum fine grids is 35-45 μm, and a height of each of the plurality of second aluminum fine grids is 10-20 μm.

20. The N-type TOPCon solar cell as claimed in claim 8, wherein a number of the plurality of second aluminum main grids is 5-12, and a width of each of the plurality of second aluminum main grids is 0.3-3.0 μm, and a height of each of the plurality of second aluminum main grids is 10-30 μm.

* * * * *